US006991979B2

(12) United States Patent
Ajmera et al.

(10) Patent No.: US 6,991,979 B2
(45) Date of Patent: Jan. 31, 2006

(54) METHOD FOR AVOIDING OXIDE UNDERCUT DURING PRE-SILICIDE CLEAN FOR THIN SPACER FETS

(75) Inventors: Atul C. Ajmera, Wappingers Falls, NY (US); Andres Bryant, Essex Junction, VT (US); Percy V. Gilbert, Poughquag, NY (US); Michael A Gribelyuk, Stamford, CT (US); Edward P. Maciejewski, Wappingers Falls, NY (US); Renee T. Mo, White Plains, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/605,311

(22) Filed: Sep. 22, 2003

(65) Prior Publication Data

US 2005/0064635 A1 Mar. 24, 2005

(51) Int. Cl.
*H01L 21/8238* (2006.01)

(52) U.S. Cl. ....................................... 438/230; 438/229

(58) Field of Classification Search ................ 438/199, 438/229, 230

See application file for complete search history.

(56) References Cited

U.S. PATENT DOCUMENTS 5,643,824 A 7/1997 Chien et al.
6,133,106 A 10/2000 Evans et al.
6,255,165 B1 7/2001 Thurgate et al.
6,391,732 B1 5/2002 Gupta et al.
6,461,951 B1 10/2002 Besser et al.
2002/0076877 A1 6/2002 Gupta et al.
2003/0011080 A1 * 1/2003 Deshpande et al. ......... 257/900

* cited by examiner

*Primary Examiner*—Bradley K. Smith
(74) *Attorney, Agent, or Firm*—Scully, Scott, Murphy & Presser; Joseph P. Abate, Esq.

(57) ABSTRACT

A method for forming a CMOS device in a manner so as to avoid dielectric layer undercut during a pre-silicide cleaning step is described. During formation of CMOS device comprising a gate stack on a semiconductor substrate surface, the patterned gate stack including gate dielectric below a conductor with vertical sidewalls, a dielectric layer is formed thereover and over the substrate surfaces. Respective nitride spacer elements overlying the dielectric layer are formed at each vertical sidewall. The dielectric layer on the substrate surface is removed using an etch process such that a portion of the dielectric layer underlying each spacer remains. Then, a nitride layer is deposited over the entire sample (the gate stack, the spacer elements at each gate sidewall, and substrate surfaces) and subsequently removed by an etch process such that only a portion of said nitride film (the "plug") remains. The plug seals and encapsulates the dielectric layer underlying each said spacer, thus preventing the dielectric material from being undercut during the subsequent pre-silicide clean process. By preventing undercut, this invention also prevents the etch-stop film (deposited prior to contact formation) from coming into contact with the gate oxide. Thus, the integration of thin-spacer transistor geometries, which are required for improving transistor drive current, is enabled.

9 Claims, 5 Drawing Sheets

METHOD FOR AVOIDING OXIDE UNDERCUT DURING PRE-SILICIDE CLEAN FOR THIN SPACER FETS

BACKGROUND OF INVENTION

The present invention relates to complementary metal oxide semiconductor (CMOS) devices, and more particularly to a process and structure for forming a metal oxide semiconductor field effect transistor (MOSFET) implementing thin sidewall spacer geometries.

FIGS. 1(*a*)–1(*e*) depict cross-section views of a portion of a semiconductor device manufactured in accordance with conventional processing techniques. As shown in FIG. 1(*a*), a semiconductor device 10 is formed on a wafer. The device includes a substrate 12 and a patterned gate stack 15 formed thereon. Each patterned gate stack 15 may be formed of a gate material such as polycrystalline silicon, for example, and as conventionally known, the gate 15 is formed on a thin gate dielectric layer 20 previously formed on top of the substrate 12. Prior to the formation of low resistivity cobalt, titanium, or nickel silicide contacts with active device regions 16, 18 and gate 15 of the semiconductor device 10, thin nitride spacers are first formed on each gate sidewall. Typically, as shown in FIG. 1(*a*), a dielectric etch stop layer 25, ranging from about 10 Å–300 Å in thickness, but preferably 50 Å–150 Å, is first deposited on the thin gate oxide layer 20 over the substrate surfaces and the patterned gate stack 15. While this dielectric etch stop prevents recessing of the substrate during reactive ion etching (RIE) of the spacer, it has the disadvantage of being susceptible to removal or undercut during the extensive preclean that must be utilized prior to silicide formation.

Then, as shown in FIG. 1(*b*), an additional dielectric layer 30 is deposited on the patterned gate stack and active device regions. This additional dielectric layer is typically formed of a nitride material.

While this dielectric etch stop prevents recessing of the substrate during spacer RIE, it has the disadvantage of being susceptible to removal or undercut during the extensive pre-clean that must be utilized prior to silicide formation.

As shown in FIG. 1(*c*), a RIE process is performed, resulting in the formation of vertical nitride spacers 35*a*, 35*b* on each gate wall. Prior to metal deposition, which may be titanium, cobalt or nickel, a lengthy oxide strip process is performed to prepare the surface for the silicide formation. This oxide strip is crucial to achieving a defect free silicide. However, as illustrated in FIG. 1(*d*), the problem with this lengthy oxide strip is that the dielectric etch stop beneath the spacers 25 becomes severely undercut at regions 40*a*, 40*b*. The resultant oxide loss or undercut gives rise to the following problems: 1) the barrier nitride layer 50 that is ultimately deposited, as shown in FIG. 1(*e*), will be in contact with the gate dielectric edge 17, thus degrading gate dielectric reliability; 2) the silicide in the source/drain regions 60*a,b* (not shown) may come into contact with the gate dielectric at the gate conductor edge, which would create a diffusion to gate short); and, 3) the degree of undercut will vary significantly from lot to lot. These aforementioned problems are particularly acute for transistors with the thin spacer geometries required for (which becoming continued CMOS scaling.

Thin sidewall spacer geometries are becoming increasingly important aspects of high performance MOSFET design. Thin spacers allow the silicide to come into close proximity to the extension edge near the channel, thereby decreasing MOSFET series resistance and enhancing drive current. The implementation of a spacer etch process (specifically RIE) benefits substantially from an underlying dielectric layer (typically oxide) beneath the nitride spacer film. This dielectric serves as an etch stop for the nitride spacer RIE. Without this etch stop in place, the spacer RIE would create a recess in the underlying substrate, degrading the MOSFET series resistance, and in the case of thin SOI substrates, reducing the amount of silicon available for the silicide process.

In order to avoid the problems associated with thin spacer geometries on thin SOI, it would be extremely desirable to provide a method for avoiding the oxide undercut when performing the oxide removal step during the pre-silicide clean.

SUMMARY OF INVENTION

It is thus an object of the present invention to provide a method for avoiding the dielectric, e.g., oxide, undercut when performing the clean step prior to silicide formation, particularly for thin spacer MOSFETS.

In accordance with this objective, it has been found that the formation of a thin nitride plug encapsulating and sealing a segment of the dielectric etch stop layer underlying the vertical spacer elements will avoid the aforementioned undercut and associated problems.

A preferred aspect of the present invention thus relates to a method for forming a CMOS device comprising the steps of: (a) providing a patterned gate stack region on the surface of a semiconductor substrate, the patterned gate stack including gate dielectric and exposed vertical sidewalls; (b) forming a dielectric etch stop layer over the gate region, exposed vertical sidewalls, and substrate surfaces; (c) forming a spacer element at each vertical sidewall, the spacer comprising of a nitride layer; (d) removing the dielectric (oxide) etch stop layer using an etch process such that a portion of the dielectric layer underlying each spacer remains; (e) forming a thin nitride layer over the gate region, the spacer elements at each vertical sidewall, and substrate surfaces; (f) etching said nitride plug layer such that a nitride plug layer remains to encapsulate and seal at least a portion of the dielectric that exists beneath the spacer; (g) performing a pre-silicide clean process for removing any material remaining from the substrate and gate conductor surfaces that may hinder silicide formation, wherein dielectric undercut is prevented by the provision of said nitride plug layer that forms an etch barrier to protect the dielectric layer beneath the spacer elements.

There are two variations to step (d) above which will be further defined here.

In the first variation of the invention, the dielectric layer removal (step (d)) includes implementing a dry etch process. For example, a RIE process may be used for the dry oxide etch. This RIE process would be selective and anisotropic such that the vertical edge of the said dielectric layer underlying the spacer that is perpendicular to the wafer surface is aligned with the vertical edge of the vertical nitride spacer element furthest from the gate. Another example of a dry process that may be used for the oxide removal is chemical downstream etching (CDE). reactive ion etching ( )CDE is not necessarily anisotropic, so the edge of the dielectric layer after CDE may or may not be vertical, and may be aligned with the vertical edge of the vertical nitride spacer element furthest from the gate or may be slightly recessed closer to the gate.

In a second variation of the invention, the dielectric layer removal (step (d)) includes implementing a wet etch process, selective such that the dielectric layer underlying the spacer is pulled back toward the gate and out of alignment with the far edge of the vertical nitride spacer element.

In either variation, the nitride plug effectively seals the portion of the dielectric (oxide) layer underlying the spacer elements to prevent the oxide removal and undercut caused by the pre-silicide cleaning process.

Also, for either variation (wet or dry removal of the oxide), the subsequent processing is similar.

There are two variations to step (f) above which are now defined. In the first variation, the nitride etch described in step (f) above is performed with a dry etch, such as RIE or CDE. Nitride is selectively removed from the source/drain regions and the top of the gate, but at least a portion of the nitride plug layer remains beside the edge of the dielectric layer. This nitride etch variation is compatible with both the oxide etch variations described above.

In the second variation, the nitride etch described in step (f) is performed with a wet or liquid phase etch. The wet nitride etch removes nitride from the source/drain regions and atop the gate, while retaining at least a portion of the nitride plug adjacent to the dielectric etch stop to block lateral oxide etching during the silicide preclean. This nitride etch variation is compatible both with CDE in the first variation of step (d) above and the wet oxide etch described in the second variation of step (d) above.

BRIEF DESCRIPTION OF DRAWINGS

Further features, aspects and advantages of the apparatus and methods of the present invention will become better understood with regard to the following description, appended claims, and the accompanying drawings where:

DETAILED DESCRIPTION

Figure 2A:
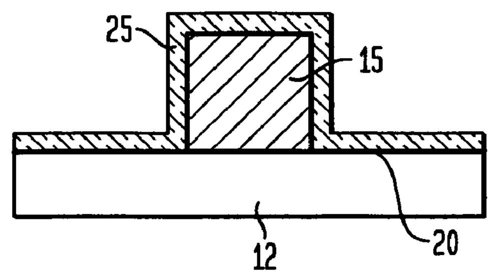
FIGS. 2(*a*)–2(*h*) are cross-sectional views showing the basic processing steps according to a first embodiment of the present invention; and, FIGS. 3(*a*)–3(*h*) are cross-sectional views showing the basic processing steps according to a second embodiment of the present invention.
Figure 2B:
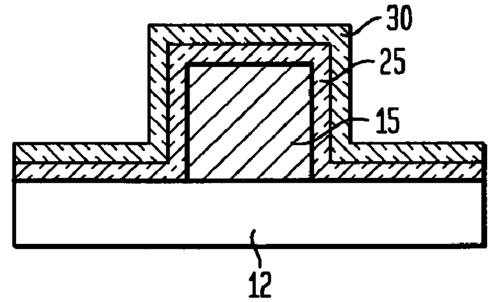
Figure 2C:
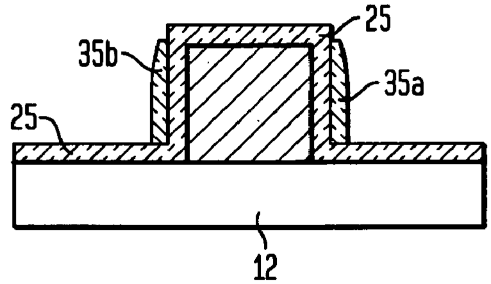
Figure 2D:
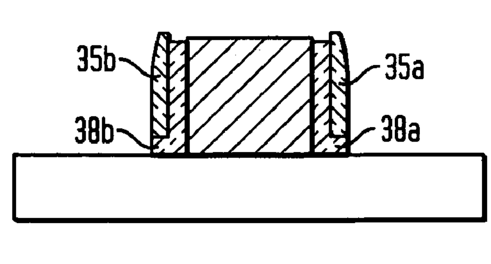
Figure 2E:
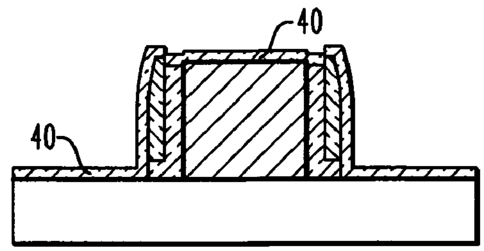
Figure 2F:
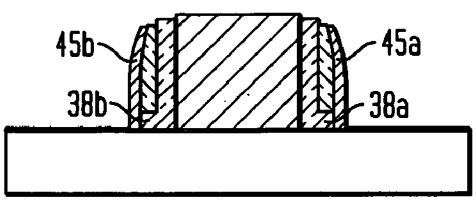
Figure 2G:
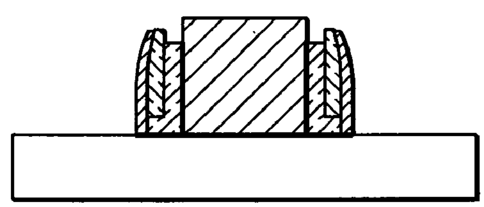
Figure 2H:
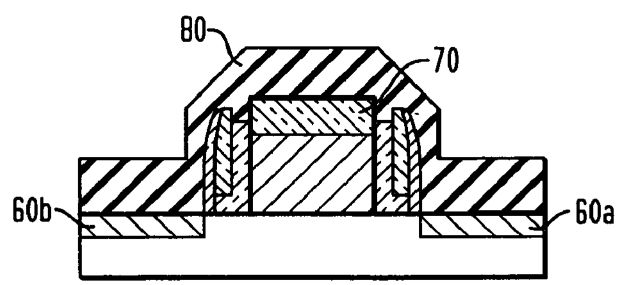

FIGS. 2(*a*)–2(*h*) depict the methodology for avoiding oxide undercut when performing a pre-silicide clean step to remove residual material from the silicon surfaces (either source/drain or gate regions). This methodology enables the formation of transistors with thin spacer geometries for improving FET series resistance.

The various processing steps and materials used in fabricating the CMOS device of the present invention, together with various embodiments thereof, will now be described in greater detail by the discussion that follows.

FIG. 2(*a*) illustrates an initial structure that is employed in the present invention. Specifically, the initial structure shown in FIG. 2(*a*) comprises a semiconductor substrate 12 having a patterned gate stack 15 formed on portions of the semiconductor substrate. In accordance with the present invention, each patterned gate stack includes a gate dielectric 20, gate conductor 15 formed atop the gate dielectric, and an additional dielectric etch stop material atop the gate conductor and substrate regions.

The structure shown in FIG. 2(*a*) is comprised of conventional materials well known in the art, and it is fabricated utilizing processing steps that are also well known in the art. For example, semiconductor substrate 12 may comprise any semiconducting material including, but not limited to: Si, Ge, SiGe, GaAs, InAs, InP, and all other III/V semiconductor compounds. Semiconductor substrate 12 may also include a layered substrate comprising the same or different semiconducting material, e.g., Si/Si or Si/SiGe, silicon-on-insulator (SOI), strained silicon, or strained silicon on insulator. The substrate may be of n-or p-type (or a combination thereof) depending on the desired devices to be fabricated.

Additionally, semiconductor substrate 12 may contain active device regions, wiring regions, isolation regions or other like regions that are typically present in CMOS devices. For clarity, these regions are not shown in the drawings, but are nevertheless meant to be included within region 12. In two highly preferred embodiments of the present invention, semiconductor substrate 12 is comprised of Si or SOI. With an SOI substrate, the CMOS device of the present invention is fabricated on the thin Si layer that is present above a buried oxide (BOX) region.

A layer of gate dielectric material 20, such as an oxide, nitride, oxynitride, high-K material, or any combination and multilayer thereof, is then formed on a surface of semiconductor substrate 12 utilizing conventional processes well known in the art. For example, the gate dielectric layer may be formed by a thermal growing process such as oxidation, nitridation, plasma-assisted nitridation, or oxynitridation, or alternatively by utilizing a deposition process such as chemical vapor deposition (CVD), plasma-assisted CVD, evaporation or chemical solution deposition.

After forming gate dielectric 20 on the semiconductor substrate 12, a gate conductor 15 is formed on top of the gate dielectric. The term "gate conductor" as used herein denotes a conductive material, a material that can be made conductive via a subsequent process such as ion implantation or silicidation, or any combination thereof. The gate is then patterned utilizing conventional lithography and etching processes well known in the art. Next, a dielectric etch stop layer 25 is formed on top of the patterned gate conductor. The dielectric etch stop or capping layer 25 is deposited atop the substrate 12 and gate stack 15. In a preferred embodiment, the capping layer 25 is an oxide, ranging from about 10 Å–300 Å in thickness, and formed utilizing a conventional deposition process such as, though not limited to, CVD, plasma-assisted CVD (PECVD), or ozone-assisted CVD. Alternatively, a conventional thermal growing process such as oxidation may be used in forming the dielectric capping layer 25.

Next, and as illustrated in FIGS. 2(*b*) and 2(*c*), spacer elements 35*a*, 35*b* are formed on the gate sidewalls. Spacer formation begins with the deposition of a nitride film 30 over the dielectric etch stop layer on the patterned gate stack, the gate sidewalls, and the substrate surfaces. The nitride thickness is 700 Å or less, and in the case of this invention is further preferred to be 500 Å or less. It is understood that these thickness values are exemplary and that other thickness regimes are also contemplated in the present invention. The composition of the nitride layer can represent any suitable stoichiometry or combination of nitrogen and silicon. The deposition process can include any of the numerous methods known in the art, such as, though not restricted to, PECVD, rapid thermal CVD (RTCVD), or low pressure CVD (LPCVD). After depositing the nitride layer 30 (via chemical vapor deposition or a similar conformal deposition process) on the structure shown in FIG. 2(*a*), the vertical gate wall spacers 35*a*, 35*b* are then formed using a highly directional, anisotropic spacer etch, such as RIE. The nitride layer is etched, selective to the underlying dielectric etch stop layer 25, to leave the vertical nitride spacers layer 35*a*, 35*b*.

The key elements of the process are now shown in FIG. 2(*d*) 2(*f*) whereby after spacer formation, the dielectric etch stop layer 25 remaining on the substrate 12 is first removed by an oxide etch process. This etch can be either dry (RIE or CDE) or wet, as conventionally known. In FIG. 2(*d*), there is depicted the RIE example for removing the remaining dielectric etch stop layer 25 save for a small portion of cap dielectric underlying the vertical nitride spacers. Once the dielectric RIE is complete, as shown in FIG. 2(*d*), the edges of the dielectric etch stop edges 38*a*, 38*b* under the vertical spacers, i.e., edges 38*a*, 38*b*, will be flush with the vertical edge of the spacer. Next, as shown in FIG. 2(*e*), a thin nitride "plug" layer 40 is deposited over the remaining structure including the exposed gate and substrate surfaces. Preferably the thin nitride plug is 100 Å or less in thickness and may include, though not limited to, $Si_3N_4$, $Si_xN_y$, carbon-containing $Si_xN_y$, an oxynitride, or a carbon-containing oxynitride. After deposition, the nitride "plug" layer 40 is etched using an anisotropic dry etch which removes the plug layer from the substrate surfaces and the top of the gate, as shown in FIG. 2(*f*). As a result of this process, thin vertical nitride portions 45*a*, 45*b* remain that function to seal the respective underlying dielectric etch stop edges 38*a*, 38*b*. If CDE is used instead of RIE to etch the dielectric etch stop layer, the edge of the etch stop may be slightly recessed with respect to the vertical spacer edge. In this case, a wet etch may be used to remove the nitride "plug" layer from the substrate surfaces and the top of the gate, leaving behind a nitride "plug" to block the dielectric etch stop from subsequent lateral etching. Once the dielectric edges are sealed, a lengthy oxide strip may be performed as depicted in FIG. 2(*g*) as part of the subsequent silicide preclean without the creation of an oxide undercut in the etch stop layer.

That is, prior to the metal deposition for silicide formation, a series of wet cleans, dry cleans, or other physical cleaning techniques, may be implemented to remove contaminants such as: resist residuals, any remaining oxides formed during plasma cleans/strips, implant residuals, metals, and particles from the surface of the silicon wafer.

Figure 1A:
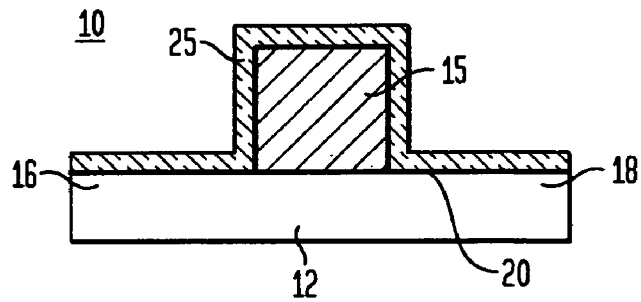
FIGS. 1(*a*)–1(*e*) are cross-sectional views showing the CMOS processing steps according to a prior art method.
Figure 1B:
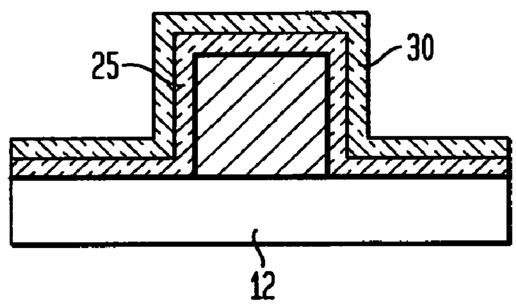
Figure 1C:
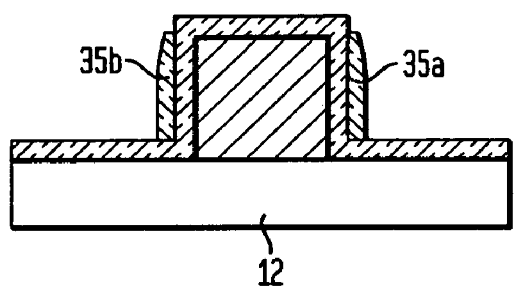
Figure 1D:
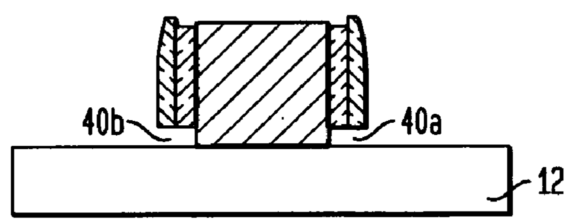
Figure 1E:
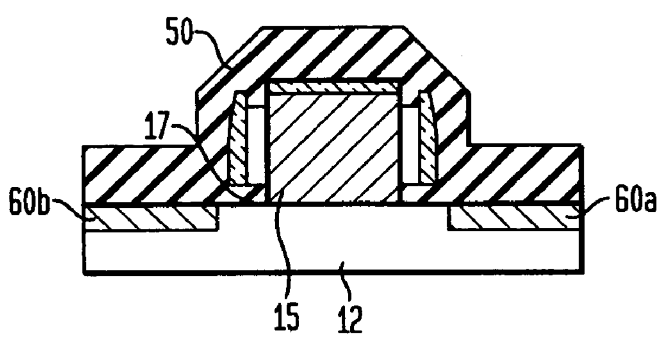

All three of the above-mentioned problems highlighted in the prior art process depicted in FIGS. 1(*a*)–1(*d*) for the conventional CMOS process are solved.

As shown in FIG. 2(*h*), with spacers and nitride plug layers in place, it is understood that source/drain regions (not shown) may be formed by conventional techniques, e.g., ion implantation into the surface of semiconductor substrate 12 utilizing a conventional ion implantation process well known in the art. It is understood, however, that at any point during the process source/drain regions may be formed. Further, it is noted that at this point of the present invention, it is also possible to implant dopants within the gate material. Various ion implantation conditions may be used in forming the deep source/drain regions within the substrate. In one embodiment, the source/drain regions may be activated at this point of the present invention utilizing conventional activation annealing conditions well known to those skilled in the art. However, it is highly preferred to delay the activation of the source/drain regions until after shallow junction regions have been formed in the substrate.

Finally, silicide contacts 60*a*, 60*b* may be formed on portions of the semiconductor substrate 12 for contact with the respective source/drain regions. Specifically, the silicide contacts may be formed utilizing a conventional silicidation process which includes the steps of depositing a layer of refractory metal, such as Ti, Ni, Co, or metal alloy on the exposed surfaces of the semiconductor substrate, annealing the layer of refractory metal under conditions that are capable of converting said refractory metal layer into a refractory metal silicide layer, and, if needed, removing any un-reacted refractory metal from the structure that was not converted into a silicide layer. Typical annealing temperatures used in forming the silicide contacts are known to skilled artisans. Note that because of the nitride spacers and nitride plug, the silicide contacts may be self-aligned to any deep junction vertical edge present in the underlying substrate.

Note that in the preferred embodiment of the present invention, as depicted in FIG. 2(*h*), a silicide region 70 is also formed atop the patterned gate stack region.

Finally, a contact etch stop (or barrier) layer 80 is deposited as a precursor to further CMOS processing, as shown in FIG. 2(*h*).

Figure 3A:
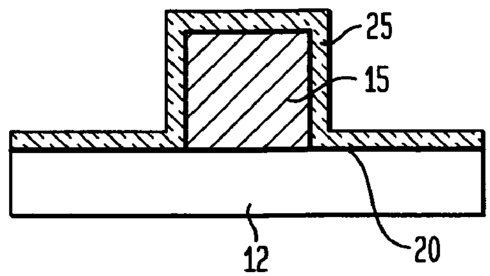
Figure 3B:
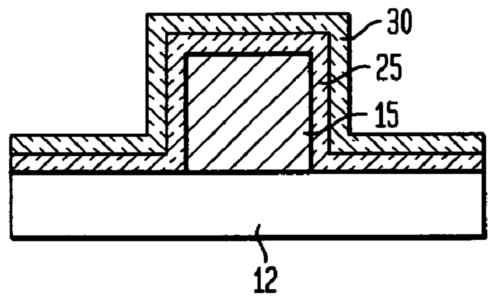
Figure 3C:
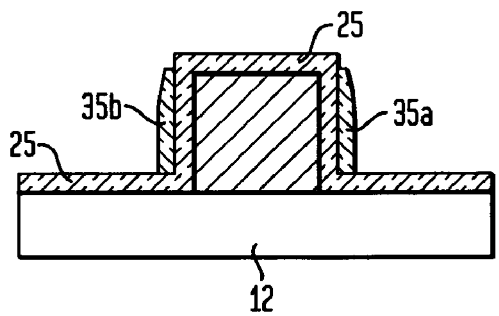
Figure 3D:
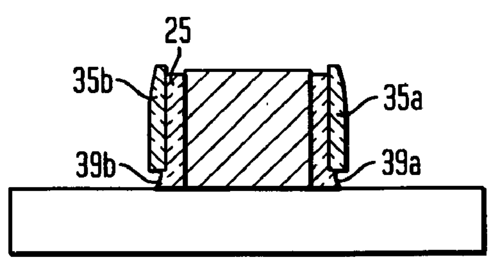
Figure 3E:
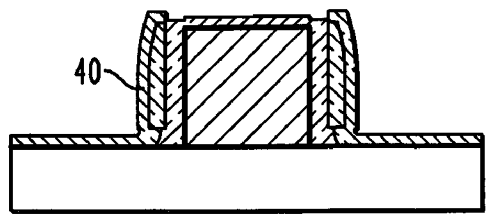
Figure 3F:
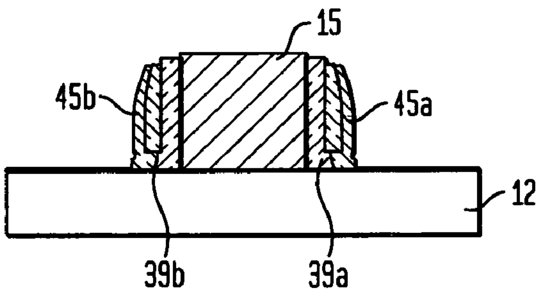
Figure 3G:
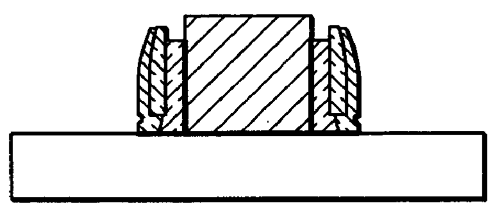
Figure 3H:
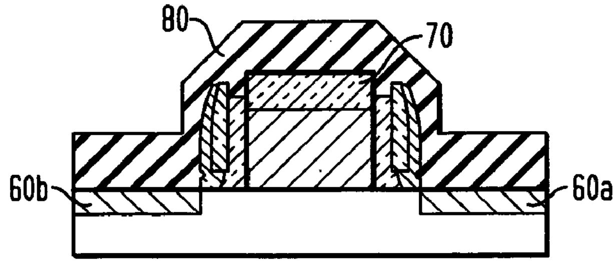

As mentioned hereinabove with respect to FIG. 2(*d*), the oxide cap layer 25 remaining on the substrate 12 is removed by an oxide etch process which may be either dry (RIE or CDE) as shown in FIG. 2(*d*) or wet, as now described with respect to FIGS. 3(*d*)–3(*h*). With respect to the second variation of the present invention, steps depicted in FIGS. 3(*a*)–3(*c*) are the same as explained herein with respect to FIGS. 2(*a*)–2(*c*). A variation of the "plug" approach however, begins with the wet etch step depicted in FIG. 3(*d*) wherein, instead of the dry approach, a wet etch is utilized to remove the remaining oxide dielectric layer 25. As known in the art, a conventional wet etch process is isotropic, and for removing the oxide layer 25, may comprise aqueous hydrofluoric acid or hydrofluoric acid in a nonaqueous solvent that may include an ammonium fluoride buffer and/or surfactants, or other soluble etchants. As a result of the wet etch process depicted in FIG. 3(*d*), there is a resultant "pullback" of the oxide 25 remaining underneath the formed vertical nitride spacers 35*a*, 35*b*. The wet etch oxide pullback, shown as 39*a*, 39*b*, formed beneath the nitride spacers 35*a*, 35*b* may be highly controlled, and the pulled-back region can be "plugged" effectively during the subsequent nitride deposition/etch processing. As shown in FIG. 3(*e*), a thin nitride "plug" layer 40 is deposited over the remaining structure including the exposed gate and substrate surfaces. Preferably the thin nitride plug is 100 Å or less, in thickness, and may include, though not limited to, $Si_3N_4$, $Si_xN_y$, carbon-containing $Si_xN_y$, an oxynitride, or a carbon-containing oxynitride.

After deposition, the nitride "plug" layer 40 is etched using a dry etch (e.g., RIE or CDE) which removes the layer on top of the gate and substrate surfaces, as shown in FIG. 3(*f*). However, as a result of this process, thin nitride "plugs" 45*a*, 45*b* remain that function to encapsulate and seal the underlying oxide dielectric portions 39*a*, 39*b*.

Once the dielectric portions are sealed, the lengthy strip may be performed during the subsequent silicide preclean (FIG. 3(*g*)) without the creation of an oxide undercut.

In another embodiment of the invention, the thin nitride plug layer can be etched using wet chemistry (with hot phosphoric acid, hydrofluoric acid in ethylene glycol, or other well know nitride etches) such that the nitride is removed everywhere except in the regions that serves to seal and encapsulate the underlying dielectric (i.e. the "plug" region).

Finally, as depicted in FIG. 3(*h*), the silicide contacts 60*a*, 60*b* are formed at each source/drain diffusion region utilizing a conventional silicidation process, as mentioned hereinabove. Optionally, a silicide contact 70 may be formed at top of gate stack 15. Then the contact etch stop (or barrier) film 80 is deposited as shown in FIG. 3(*h*).

Advantageously, all three of the above-mentioned problems highlighted in the prior art process depicted in FIGS. 1(*a*)–1(*d*) for the conventional CMOS process are solved.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A complementary metal oxide semiconductor (CMOS) structure comprising:

a gate region formed on a surface of a semiconductor substrate, said gate including an dielectric layer formed on exposed vertical sidewalls thereof and a substrate surface;

a vertical nitride spacer element formed on each said vertical sidewall of said gate stack overlying said dielectric layer, whereby a portion of said dielectric layer underlies said vertical nitride spacer above said substrate surface such that an edge of said portion of said dielectric layer underlying said vertical nitride spacer is aligned with an outer edge of said vertical nitride spacer element;

a nitride plug formed over said gate stack, vertical nitride spacer elements an said edge of said portion of dielectric layer underlying said vertical nitride spacer, said nitride plug encapsulating and sealing said underlying dielectric layer; and, silicide contacts formed on other portions of said semiconductor substrate adjacent said patterned gate region, for contact with drain and source regions formed in said semiconductor substrate.

2. The complementary metal oxide semiconductor (CMOS) structure as claimed in claim 1, wherein an edge of said portion of said dielectric layer underlying said vertical nitride spacer is pulled back out of alignment with a vertical edge of said vertical nitride spacer element.

3. The complementary metal oxide semiconductor (CMOS) structure as claimed in claim 1, wherein said semiconductor substrate is comprised of Si, Ge, SiGe, GaAs, InAs, InP, Si/Si, Si/SiGe, or silicon-on-insulators.

4. The complementary metal oxide semiconductor (CMOS) structure as claimed in claim 3, wherein said semiconductor substrate is comprised of Si or silicon-on-insulator.

5. The CMOS structure of claim 1, wherein said patterned gate region includes at least a gate dielectric and a gate conductor material.

6. The CMOS structure of claim 5, wherein said gate dielectric is comprised of an oxide, a nitride, an oxynitride, or combinations and multilayers thereof.

7. The CMOS structure of claim 5, wherein said gate dielectric is an oxide selected from the group consisting of $SiO_2$, $ZrO_2$, $Ta_2O_5$, $HfO_2$ and $Al_2O_3$.

8. The CMOS structure of claim 5, wherein said gate material is comprised of polysilicon, amorphous silicon, elemental metals that are conductive, alloys of elemental metals that are conductive, silicides or nitrides of elemental metals that are conductive or any combination thereof.

9. The CMOS structure of claim 8, wherein said gate material is comprised of polysilicon or amorphous silicon.

* * * * *